(12) United States Patent
Ge

(10) Patent No.: US 6,906,295 B2
(45) Date of Patent: Jun. 14, 2005

(54) FOODWARE WITH MULTILAYER STICK RESISTANT CERAMIC COATING AND METHOD OF MAKING

(75) Inventor: Molly Mo Hui Ge, Arlington Heights, IL (US)

(73) Assignee: National Material L.P., Elk Grove Village, IL (US)

( * ) Notice: Subject to any disclaimer, the term of this patent is extended or adjusted under 35 U.S.C. 154(b) by 0 days.

(21) Appl. No.: 10/371,198

(22) Filed: Feb. 20, 2003

(65) Prior Publication Data

US 2004/0166378 A1 Aug. 26, 2004

(51) Int. Cl.[7] ................................................. B32B 9/00
(52) U.S. Cl. ...................... 219/621; 428/212; 428/216; 428/336; 428/469; 428/472; 428/697; 428/698; 428/699
(58) Field of Search .......................... 219/621; 428/212, 428/216, 336, 469, 472, 697, 698, 699

(56) References Cited

U.S. PATENT DOCUMENTS

| | | | | |
|---|---|---|---|---|
| 4,436,830 A | * | 3/1984 | Andreev et al. | 501/96.1 |
| 4,554,201 A | * | 11/1985 | Andreev et al. | 428/699 |
| 5,262,241 A | | 11/1993 | Huggins | |

(Continued)

FOREIGN PATENT DOCUMENTS

| EP | 0872575 | * | 10/1998 |
|---|---|---|---|
| EP | 1132498 A1 | * | 9/2001 |
| EP | 1219723 A2 | * | 7/2002 |
| JP | 07-237010 | * | 9/1995 |
| JP | 08-120445 | * | 5/1996 |
| JP | 09-256138 | * | 9/1997 |
| JP | 09-232204 | * | 12/1997 |
| JP | 09-323205 | * | 12/1997 |
| JP | 10-251831 | * | 9/1998 |
| JP | 11-131215 | * | 5/1999 |
| JP | 11-131216 | * | 5/1999 |
| JP | 11-156992 | * | 6/1999 |
| JP | 2000297365 | * | 10/2000 |
| JP | 2001254187 | * | 9/2001 |

OTHER PUBLICATIONS

Jehn et al, "Morphology and properties of sputtered (Ti,Al)N layers on high speed steel substrates as a function of deposition temperature and sputtering atomosphere," J. Vac. Sci. Technol. A 4 (6), Nov./Dec. 1986, pp. 2701–2705.

Knotek, O., Bohmer, M. and Leyendecker, T., "On structure and properties of sputtered Ti and Al based hard compound films," J. Vac. Sci. Technol. A 4 (6), Nov./Dec. 1986, pp. 2695–2700.

Munz, Wolf–Dieter, "Titanium aluminum nitride films: A new alternative toTiN coatings," J. Vac. Sci. Technol. A 4 (6), Nov./Dec. 1986, pp. 2717–2725.

(Continued)

Primary Examiner—Archene Turner
(74) Attorney, Agent, or Firm—Dinsmore & Shohl LLP

(57) ABSTRACT

A foodware article having a multilayer, stick resistant, ceramic coating. The foodware article of the present invention includes a metal foodware article having an inner food-contacting surface and an outer surface; a bonding layer deposited on the food-contacting surface; and a first layer of (Ti,Al,Cr)N deposited adjacent to the bonding layer. There is optionally a layer of chromium nitride deposited adjacent to the first (Ti,Al,Cr)N layer, and a second layer of (Ti,Al,Cr)N deposited on the chromium nitride layer. These layers can be repeated as many times as desired. The (Ti, Al, Cr)N layer is generally the top layer of the multilayer coating. The coating is stick resistant, scratch resistant, thermally stable, corrosion resistant, and color stable. The foodware is suitable for use with both salty-based and acidic-based foods. A method of making such a foodware article is also disclosed.

29 Claims, 2 Drawing Sheets

U.S. PATENT DOCUMENTS

| | | | |
|---|---|---|---|
| 5,403,882 A | | 4/1995 | Huggins |
| 5,447,803 A | * | 9/1995 | Nagaoka et al. ............ 428/698 |
| 5,503,912 A | * | 4/1996 | Setoyama et al. .......... 428/698 |
| 5,525,420 A | * | 6/1996 | Kaufmann .................. 428/698 |
| 5,562,991 A | | 10/1996 | Tannenbaum |
| 5,700,551 A | * | 12/1997 | Kukino et al. .............. 428/336 |
| 5,810,947 A | | 9/1998 | Wu et al. |
| 5,879,532 A | | 3/1999 | Foster et al. |
| 5,879,823 A | | 3/1999 | Prizzi et al. |
| 5,880,205 A | | 3/1999 | Tannenbaum |
| 5,882,777 A | * | 3/1999 | Kukino et al. .............. 428/216 |
| 6,033,734 A | * | 3/2000 | Muenz et al. ............... 427/309 |
| 6,033,768 A | * | 3/2000 | Muenz et al. ............... 428/699 |
| 6,080,496 A | | 6/2000 | Hupf et al. |
| 6,090,223 A | | 7/2000 | Kiuchi et al. |
| 6,103,074 A | | 8/2000 | Khominich |
| 6,114,028 A | | 9/2000 | Muchin et al. |
| 6,197,438 B1 | | 3/2001 | Faulkner |
| 6,360,423 B1 | | 3/2002 | Groll |
| 6,399,219 B1 | | 6/2002 | Weity et al. |
| 6,427,904 B1 | | 8/2002 | Groll |
| 6,492,011 B1 | * | 12/2002 | Brandle et al. ............. 428/697 |
| 6,497,772 B1 | | 12/2002 | Meckel et al. |
| 2002/0040905 A1 | | 4/2002 | Groll |

OTHER PUBLICATIONS

McIntyre et al., "Oxidation of metastable single–phase polycrystalline $Ti_{0.5}Al_{0.5}N$ films: Kinetics and mechanisms," J. Appl. Phys. 67 (3), Feb. 1, 1990, pp. 1542–1553.

Knotek, et al., "On Wear and Corrosion Resistant PVD CrN Coatings," 8. Int. Congr. on Heat Treatm. of Mater. Kyoto, Japan 1992, o.S., pp. 543–546.

Ichimura, Hiroshi, and Kawana, Atsuo, "High temperature oxidation of ion–plated CrN films," J. Mater. Res., vol. 9, No. 1, Jan. 1994, pp. 151–155.

Donahue et al, "Microstructure and oxidation–resistance of $Ti_{1-x-y-z}Al_xCr_yY_zN$ layers grown by combined steered–arc/unbalanced– magnetron–sputter deposition," Surface and Coatings Technology 94–95, 1997, pp. 226–231.

Aouadi, S.M., Gorishnyy, T.Z., and Rohde, S.L., "In–Situ Ellipsometry Study on Nitride Coatings," Invited Paper, Vacuum Technology & Coating, Sep. 2002, pp. 33–38.

Anders, A., "Part 1: Cathodic Arc Plasma Deposition," Vacuum Technology & Coating, Jul. 2002, pp. 27–35.

Hovsepian et al., Advanced Application Tailored PVD Coatings Utilizing Nanoscale Multilayer Superlattice Structures, pp. 29–35, Nov. 2002.

Pellman, M., Multi–Arc, Inc., PVD Coatings for Medical Device Applications, http:/www.pfonline.com/articles/070003.html, Jul. 2000.

Aharonov et al., How Chromium Nitride performs on metal forming dies, The Fabricator, Jun. 1995, pp. 26–29.

Wadsworth et al., Thermal stability and oxidation resistance of TiAlN/CrN multilayer coatings, Surface and Coatings Technology 94–95 (1997) 315–321.

Chiba et al., Wear resistance of arc ion–plated chromium nitride coatings, J. Mater. Res., vol. 8, No. 5, May 1993, pp. 1109–1115.

Luo, Q. et al: "Tribological investigation of TiAlCrN and TiAlN/CrN coatings grown by combined steered–arc/unbalanced magnetron deposition" VACUUM, 53(1–2), 123–126 CODEN, 1999.

* cited by examiner

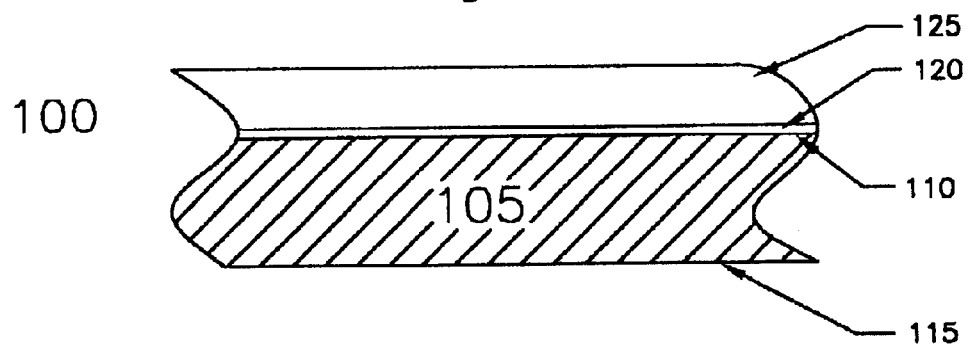
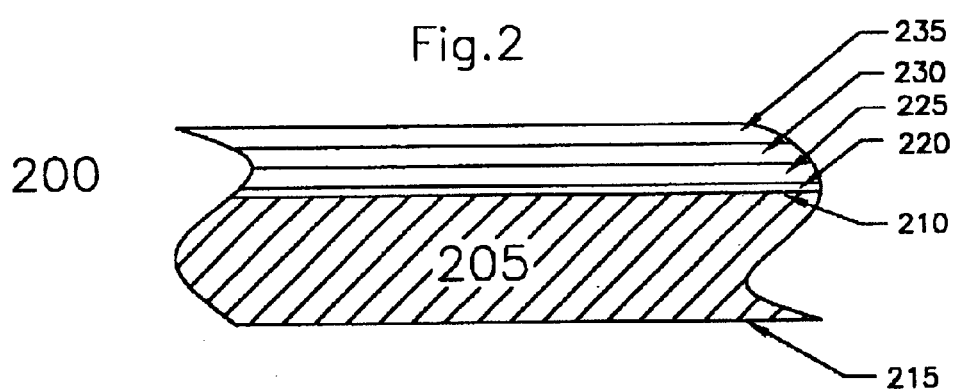
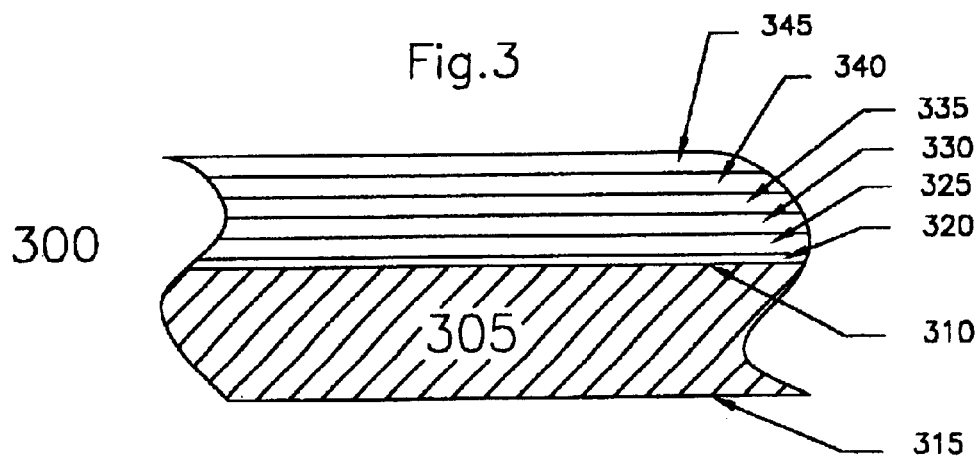

Fig.4
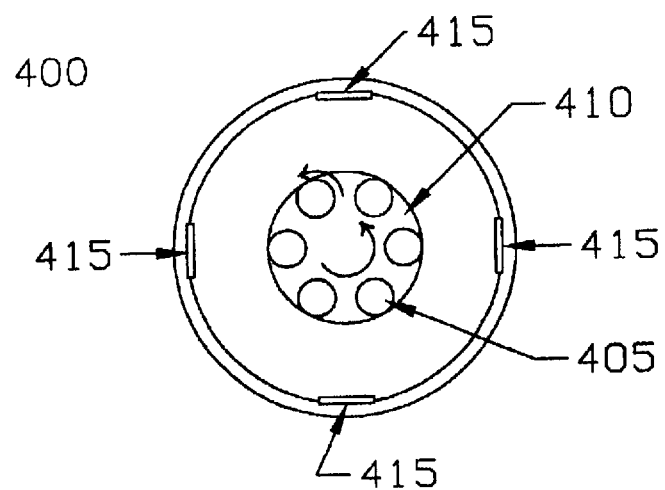
Fig.5
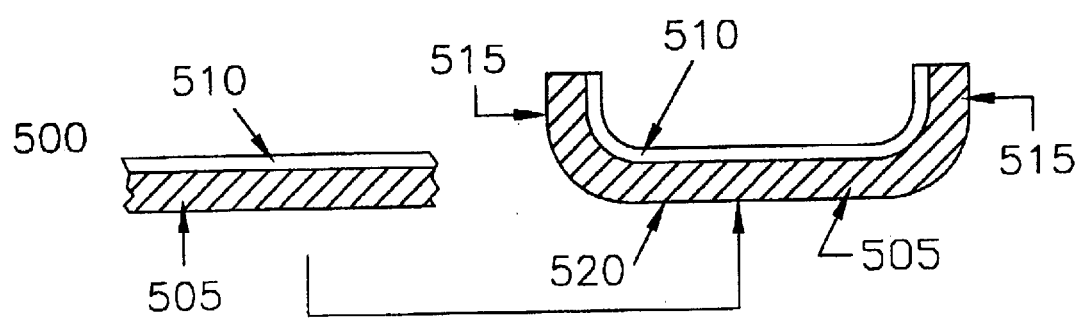
Fig.5a  Fig.5b

FOODWARE WITH MULTILAYER STICK RESISTANT CERAMIC COATING AND METHOD OF MAKING

BACKGROUND OF THE INVENTION

The invention relates generally to a foodware article having stick resistant properties, and more particularly to a foodware article having a multilayer, durable, stick resistant, ceramic coating, and to a method of making such foodware articles.

Cookware can be made a variety of materials, including cast iron, copper, aluminum, and steel. Each type of cookware has advantages and disadvantages.

Seasoned cast iron cookware has a tough, abrasion resistant surface. However, cast iron is subject to rusting, and it must be cleaned carefully to avoid damage to the cookware surface. In addition, acid in foods can cause leaching of the iron from the surface, which can lead to health problems in some cases.

Copper cookware has excellent heat transfer properties. However, it is easily scratched because it is much softer than other cookware materials, such as cast iron or stainless steel. Copper also oxidizes readily, which leads to tarnishing. Copper can be polished to remove the tarnish, but it requires substantial effort to maintain the surface finish. Copper ions can also leach into foods.

Stainless steel cookware is widely used. It is known for its strength and durability. Stainless steel is relatively easy to clean, and it holds its shine better than copper. However, food is more likely stick to stainless steel than to seasoned cast iron. Overheating, cooking with salt water, or letting the pan "cook dry" causes discoloration of the surface. In addition, although it is typically quite low, leaching of ions, such as iron, chromium, manganese, and nickel, can also be a concern with stainless steel.

Aluminum cookware has excellent heat transfer properties. However, aluminum is also subject to leaching of ions. One way to reduce this problem is to coat the surface of the aluminum. Anodized aluminum is coated with aluminum oxide. The oxide layer makes it much harder than untreated aluminum. (Untreated aluminum has a thin layer of aluminum oxide from reaction with oxygen in the air.) However, food will generally stick to anodized aluminum cookware unless oil is used in cooking. In addition, anodized aluminum cookware is not dishwasher-safe, as it can be discolored or corroded by typical automatic dishwashing products.

Aluminum can also be treated by thermal spraying to prevent leaching. However, this process produces a rough surface, and food will generally stick to the surface unless it is treated.

One well-known surface treatment for cookware involves the use of perfluorocarbon polymers. Perfluorocarbon coatings provide a non-stick surface, but they are easily scratched. Even though current perfluorocarbon coatings are tougher than their predecessors, they are still fairly easy to scratch. When the surface is scratched or nicked, flakes of the perfluorocarbon coating can get into the food being cooked. This flaking is objectionable to many people, despite the fact that perfluorocarbon flakes are not known to pose a health risk. In addition, although the perfluorocarbon polymers are safe at normal cooking temperatures, they can be damaged at high temperatures and may give off toxic fumes.

Another surface treatment involves the use of ceramic coatings. U.S. Pat. No. 5,447,803 describes the deposition of a layer of titanium and a layer of titanium nitride. The titanium nitride coating has high hardness, and a gold color. The titanium nitride coating can be oxidized or nitrided to stabilize the color, but these oxide or nitride coatings are thin and can still be scratched, resulting in possible discoloration of the pan.

U.S. Pat. No. 6,197,438 describes the use of a thick layer (about 2 to 50 microns) of chromium nitride or aluminum nitride as a primer or topcoat layer to achieve scratch resistance and non-stick properties. A decorative or functional top coat layer such as silicon nitride, alumina, or diamond-like carbon can be added. Ceramic coated foodware based on a plasma-sprayed aluminum alloy substrate is also disclosed.

U.S. Pat. No. 6,360,423 describes the deposition of a zirconium nitride coating on cookware. The surface must be polished to a high surface smoothness before the zirconium nitride layer is deposited in order to obtain a stick resistant coating. Although the zirconium nitride coating does not need to be oxidized or nitrided to stabilize the color, zirconium nitride can be discolored in varying degrees by overheating or by salty-based foods.

Therefore, there remains a need for a scratch resistant, color-stable, stick resistant ceramic coating having the appearance of metal, and suitable for use with both acidic and salty-based foods.

SUMMARY OF THE INVENTION

The present invention meets this need by providing a foodware article having stick resistant properties. By "foodware," I mean cookware, food preparation pieces including cutlery and other manual food processing pieces (such as colanders, strainers, and the like), food serving pieces (such as plates, bowls, and the like), and utensils for eating food. By "cookware," I mean pots and pans for stovetop cooking, bakeware, griddles, grills, cooking utensils (such as spoons, spatulas, and the like), and food preparation devices that are used to cook food (such as electric frying pans, rice cookers, and the like). By "stick resistant," I mean that the foodware article at least has stick resistant properties; it may have non-stick properties as well.

The foodware article of the present invention includes a metal foodware article having an inner food-contacting surface and an outer surface; a bonding layer deposited on the food-contacting surface; and a first layer of (Ti,Al,Cr)N deposited adjacent to the bonding layer. By "(Ti,Al,Cr)N," I mean a nitride alloy of titanium, aluminum, and chromium. Nitride alloys of titanium, aluminum, and chromium include, but are not limited to a superlattice structured coating of titanium aluminum nitride, and chromium nitride. By "deposited on," I mean deposited directly on the previous layer without any intervening layers. By "deposited adjacent to," I mean deposited next to, but not necessarily directly on, the previous layer. It could be deposited directly on the previous layer, or there could be one or more intervening layers between layers deposited adjacent to one another.

There is optionally a layer of chromium nitride deposited adjacent to the first (Ti,Al,Cr)N layer, and a second layer of (Ti,Al,Cr)N deposited on the chromium nitride layer. These alternating layers can be repeated as many times as desired.

The bonding layer can be a metal. Suitable metals include, but are not limited to titanium, chromium, zirconium, or alloys thereof.

The metal foodware article can be made of a metal including, but not limited to, steel, stainless steel, copper, titanium, cast iron, aluminum, clad material, or alloys thereof.

The thickness of the chromium nitride layer is generally less than about 2 microns. When there are alternating layers of chromium nitride and (Ti,Al,Cr)N layers, the thickness of each of the (Ti,Al,Cr)N layers and the chromium nitride layers are generally in a range of from about 0.1 to about 2.0 microns.

The total thickness of the multilayer coating is generally in the range of from about 1.0 to about 20 microns, typically in the range of from about 1.5 to about 10 microns.

Another aspect of the invention involves a method of making a foodware article having a multilayer, stick resistant, ceramic coating. The method includes providing a metal substrate having an inner food-contacting surface and an outer surface; depositing a bonding layer on the food-contacting surface; depositing a first layer of (Ti,Al,Cr)N adjacent to the bonding layer; and forming the metal substrate into the foodware article.

The multilayer coating may be deposited by a method including, but not limited to, a physical vapor deposition method. The multilayer coating may be deposited by a cathodic arc deposition process, if desired.

BRIEF DESCRIPTION OF THE DRAWINGS

FIG. 1 is a cross-section of one embodiment of the foodware article of the present invention.

FIG. 2 is a cross-section of another embodiment of the foodware article of the present invention.

FIG. 3 is a cross-section of another embodiment of the foodware article of the present invention.

FIG. 4 is a schematic diagram of a cathodic arc deposition chamber useful in the present invention.

FIG. 5 is a schematic drawing of a metal blank coated by the present invention and shallow-drawn into a pan.

DETAILED DESCRIPTION OF THE INVENTION

Titanium aluminum nitride (Ti,Al)N coatings are commonly used in dry and high-speed machining operations because of its high oxidation resistance and abrasion resistance. The maximum working temperature on (Ti,Al)N (TiAl target 50/50 At %) can reach 1450° F. making it more thermally stable than other physical vapor deposition (PVD) coatings such as TiN, TiCN, $CrN_x$, and ZrN. The microhardness of (Ti,Al)N (TiAl=50/50 At %) is harder than that of TiN, $CrN_x$, or ZrN, varying between 2600–3000 HV, 0.05, depending on the PVD process used.

Chromium nitride ($CrN_x$) coating exhibits mechanical and corrosion resistance complementary to (Ti,Al)N.

A smooth (Ti,Al,Cr)N layer possesses the characteristics of a non-reactive surface, resulting in at least stick resistant performance, and often non-stick performance. If desired, the superlattice concept, (Ti,Al)N/$CrN_x$, system, can be utilized in the present invention to produce a (Ti,Al,Cr)N coating suitable for application to foodware.

The (Ti,Al,Cr)N layer has high corrosion resistance and passes the 96 hr ASTM B 368–97 test, a copper accelerated acetic acid-salt spray test, which is a severe test for corrosion resistance.

Cookware having the multilayer (Ti,Al,Cr)N coating of the present invention is suitable for cooking both acidic and salty-based foods without discoloration. In addition, the cookware can be used at any high cooking temperatures without worrying about damaging the cookware.

The (Ti,Al,Cr)N coating is much harder than (Ti,Al)N and $CrN_x$, resulting in high abrasion resistance. The (Ti,Al,Cr)N layer combines extreme hardness and high corrosion resistance, making the cooking surface of the cookware scratch resistant, stick resistant, and durable. It eliminates the problem of ions leaching from the base material of the cookware. The (Ti,Al,Cr)N layer is generally the top layer of the multilayer coating.

A coating of alternating (Ti,Al,Cr)N/$CrN_x$ layers is desirable because it further improves the toughness of the multilayer coating. This feature allows drawing a metal sheet with a thin multilayer coating without cracking the coating in the forming process.

FIG. 1 shows a cross-section of one embodiment 100 of the foodware article of the present invention. There is a metal foodware article 105, such as a pan. The metal foodware article 105 has an inner food-contacting surface 110 and an outer surface 115. The metal foodware article can be made of various materials, including, but not limited to steel, stainless steel, copper, aluminum, titanium, cast iron, clad materials, and alloys thereof. The metal foodware article can be made of a solid metal or a solid alloy, or it can be a clad material, such as a multilayer structure having a metal surface. Examples of multilayer structures, include, but are not limited to, stainless steel-clad aluminum or copper, aluminum having a plasma sprayed stainless steel coating, or metal outer layers surrounding non-metallic core materials, such as graphite.

There is a bonding layer 120 deposited on the food-contacting surface 110. The bonding layer is generally less than about 1.0 micron thick. The bonding layer can be a metal. Suitable metals include, but are not limited to, titanium, chromium, zirconium, or alloys thereof. In one embodiment, the bonding layer is chromium.

A first layer of (Ti,Al,Cr)N 125 is deposited adjacent to the bonding layer 120. The first (Ti,Al,Cr)N layer 125 is typically less than about 10 microns in this embodiment. The first (Ti,Al,Cr)N layer 125 provides a strong, scratch resistant, stick resistant layer. Although the first (Ti,Al,Cr)N layer is shown as being deposited on the bonding layer in this embodiment, there could be one or more intervening layers between the bonding layer 120 and the first (Ti,Al,Cr)N layer 125, if desired. The total coating thickness is generally in the range of from about 1.0 to 20.0 microns.

FIG. 2 shows a cross-section of another embodiment 200 of a foodware article of the present invention. There is a metal foodware article 205 having an inner food-contacting surface 210 and an outer surface 215. A bonding layer 220 is deposited on the food-contacting surface 210. A first layer of (Ti,Al,Cr)N 225 is deposited adjacent to the bonding layer 220. Although the first (Ti,Al,Cr)N layer is shown as being deposited on the bonding layer in this embodiment, there could be one or more intervening layers between the bonding layer 220 and the first (Ti,Al,Cr)N layer 225, if desired. The first (Ti,Al,Cr)N layer 225 is typically in the range of from about 0.1 to about 1.5 microns thick. The first (Ti,Al,Cr)N layer provides a strong, scratch resistant, thermally stable base layer for the multilayer ceramic coating.

A first layer of chromium nitride 230 is deposited adjacent to the first (Ti,Al,Cr)N layer 225. Although the first chromium nitride layer 230 is shown as being deposited on the first (Ti,Al,Cr)N layer 225 in this embodiment, there could be one or more intervening layers between the first (Ti,Al,Cr)N layer 225 and the first chromium nitride layer 230, if desired. The first chromium nitride layer 230 is generally less than about 2 microns thick. In the event the upper layers are penetrated, the first chromium nitride layer provides corrosion resistance and oxidation resistance.

A second layer of (Ti,Al,Cr)N 235 is deposited on the first chromium nitride layer 230. The second (Ti,Al,Cr)N layer is generally less than about 10 microns thick.

FIG. 3 shows a cross-section of another embodiment 300 of a foodware article of the present invention. There is a metal foodware article 305 having an inner food-contacting surface 310 and an outer surface 315. A bonding layer 320 is deposited on the food-contacting surface 310. A first layer of (Ti,Al,Cr)N 325 is deposited adjacent to the bonding layer 320. Although the first (Ti,Al,Cr)N layer 325 is shown as being deposited on the bonding layer 320 in this embodiment, there could be one or more intervening layers between the bonding layer 320 and the first (Ti,Al,Cr)N layer 325, if desired. A first layer of chromium nitride 330 is deposited adjacent to the first (Ti,Al,Cr)N layer 325. Although the first chromium nitride layer 330 is shown as being deposited on the first (Ti,Al,Cr)N layer 325 in this embodiment, there could be one or more intervening layers between the first chromium nitride layer 330 and the first (Ti,Al,Cr)N layer 325, if desired. A second layer of (Ti,Al,Cr)N 335 is deposited on the first chromium nitride layer 330. This is followed by a second layer of chromium nitride 340 and a third layer of (Ti,Al,Cr)N 345. Although these layers are shown as being deposited on the preceding layer in this embodiment, there could be one or more intervening layers between the second layer of chromium nitride and the preceding layer, if desired.

Additional alternating layers of chromium nitride and (Ti,Al,Cr)N can be deposited, if desired. Each layer of (Ti,Al,Cr)N and chromium nitride is typically in the range of from 0.1 to about 2.0 microns. Thinner layers are desirable because the mechanical and corrosion resistance of the multilayer coating is improved.

One desirable embodiment contains alternating layers of (Ti,Al,Cr)N/CrN$_x$. The top layer is typically the (Ti,Al,Cr)N layer.

The coating layers can be deposited using a physical vapor deposition process, such as evaporation, sputtering, cathodic arc, or ion beam, or using another suitable process.

As an example, one process for depositing a coating on a foodware article will be described. Other processes or steps can be used, as is well-known to those of skill in the art.

The foodware article can be formed first and then coated, or a flat metal sheet can be coated and then formed into the pan. The process will be described for coating a preformed pan.

The pan can be polished before deposition to create a smooth surface, if necessary. Buffing or grinding compound, or another polishing medium, as is known to those in the art, can be used. The surface should be as smooth as possible, generally less than 16 micro inches measured perpendicular to the concentric ground line on the surface, and typically in the range of 10–16 micro inches, although it is not necessary to achieve an ultra-bright surface finish, such as 2–4 micro inches.

The pan is then thoroughly cleaned and dried to remove any grease, polish residual, loose and embedded particles, oxides, salt residue, or other foreign material. A typical cleaning would involve an aqueous cleaning system in conjunction with ultrasonic cleaning.

The pan is loaded into a suitable fixture, and placed in the planetary of the deposition chamber 400, as shown in FIG. 4. The pans 405 can be subjected to one or two fold planetary rotation during deposition, as shown. The support 410 can rotate all of the pans, and the individual pans 405 can be rotated, if desired.

Appropriate targets 415 are placed in the chamber as shown in FIG. 4. For example, compressed metal powder targets of 50% titanium/50% aluminum (At %) can be used, along with compressed powdered metal targets of pure chromium. Titanium/aluminum/chromium targets could be used in conjunction with chromium targets, as well as other combinations, as is well known in the art. The number and type of targets will depend on the size of the chamber and the coating being deposited.

The chamber is pumped to a pressure of about $10^{-3}$ Pa. The pan is heated to a temperature in the range of about 350° F.–450° F., depending on the type of material the pan is made of.

A glow discharge is created by biasing the pan with a negative voltage of about 800–1200V to micro-clean the pan.

The bonding layer is deposited first. The appropriate targets are ignited (for example, Cr) and the pan is bombarded with ions ($Cr^+$) at a bias voltage of about 600–1000V at a vacuum level of about $10^{-2}$ Pa, forming a bonding layer with a thickness of less than about 1.0 micron.

Turning on all of the TiAl and Cr targets, nitrogen is then introduced into the system to form the (Ti,Al,Cr)N coating. The applied voltage is about 80–200V at a vacuum level of about 0.4–1.5 Pa.

The TiAl cathodes are turned off, while the Cr cathodes remain on to deposit a layer of chromium nitride at a bias voltage of 80–200V and a vacuum level of about 0.4–1.5 Pa.

The TiAl cathodes are then turned back on to deposit another layer of (Ti,Al,Cr)N. This procedure can be repeated to deposit as many layers of chromium nitride and (Ti,Al,Cr)N as desired. The deposition temperature can be raised up to about 600° F.–900° F. at the end of deposition, depending on the material the pan is made of.

The pan can be given a final polish using Jeweler Rouge, diamond compound or another polishing medium, as is known to those skilled in the art, to achieve a surface that is free of embedded particulate and coating residuals.

The composition of the various (Ti,Al,Cr)N layers can be the same, or it can be different for different layers, if desired. The composition can be varied by altering the number and type of targets being used for each layer, as is well-known in the art.

In a cathodic arc deposition process, the number of Cr targets is desirably greater than or equal to the number of TiAl targets used in depositing the (Ti,Al,Cr)N layer, so as to balance all of the combined physical properties (i.e., stick resistance, oxidation resistance, toughness, color stability, etc.) of the coating. When the number of TiAl is greater than the number of Cr targets, the (Ti,Al,Cr)N coating shows slight discoloration in cooking salty-based foods, although the resultant (Ti,Al,Cr)N coating is still well suited for use as a stick resistant coating. Although the discoloration may not be desirable for cosmetic reasons for some uses, it may not be a problem for other uses. It can be easily removed using Bar Keepers™ cleaner or a few drops of lemon juice.

Experiment 1

An egg was fried in pans or pots having different treated surfaces, in order to compare the coating of the present invention to existing coatings with respect to stick resistance performance. Examples 1 and 2 were stainless steel pots made of a clad material having an aluminum core. Examples 3 and 4 were zirconium nitride coated bakeware made of a clad material with an aluminum core. Examples 5 and 6 were PTFE coated aluminum pans.

Examples 7, 8, and 9 were 7.5 inch diameter stainless steel pots made of a clad material with an aluminum core.

The pots were coated using the process described above. The coatings were alternating layers of (Ti,Al,Cr)N/CrN$_x$, and the coating thickness was about 2 microns. In depositing the (Ti,Al,Cr)N layers, three Cr targets and one TiAl target were used for coating 1220, while coating 1–14 used four Cr targets and one TiAl target.

The pots and pans were either sprayed with cooking oil or not sprayed with cooking oil, and an egg was fried in each pot or pan. After cooking the egg, the pots and pans were evaluated for their non-stick performance. This procedure was repeated ten times. The conditions and results are shown in Table 1.

Example 1 was sprayed with oil, which was then wiped off with a paper towel, leaving some residual oil. The egg stuck to the pot. In Example 2, it was sprayed with a little oil, and the pot showed brown residue after cooking the egg.

When no oil was used for Example 3, the bottom of the fried egg stuck to the zirconium nitride-coated bakeware. The pan showed slight discoloration. When a small amount of oil was sprayed onto the pan in Example 4, there was a no sticking.

In Example 5, the PTFE-coated pan showed sticking when no oil was used. When a small amount of oil was sprayed on the pan in Example 6, there was no sticking.

In Examples 7 and 8, the pans were sprayed with oil, and the oil was wiped off with a paper towel, leaving some residual oil. The fried egg did not stick.

In Example 9, the same pan was used as in Example 8, but no oil was used. The fried egg stuck to the pan. No discoloration was found.

The performance of the coating of the present invention was comparable to the non-stick PTFE coating.

TABLE 1

Egg Frying Test

| Example | Cookware/ Coating | Amount of Oil | Heat | Non-stick | Stick |
|---|---|---|---|---|---|
| 1 | S.S. | Spray oil/ Wipe off | Low |  | X |
| 2 | S.S. | Spray a little oil | Low | Brown Tints |  |
| 3 | S.S./ZrN | No oil | Low |  | X Slight Discoloration |
| 4. | S.S./ZrN | Spray a little oil | Low | X |  |
| 5 | Al/PTFE | No oil | Low |  | X |
| 6 | Al/PTFE | Spray a little oil | Low | X |  |
| 7 | S.S./1220 | Spray oil/ Wipe off | Low | X |  |
| 8 | S.S./1–14 | Spray oil/ Wipe off | Low | X |  |
| 9 | S.S./1–14 | No oil | Low |  | X |

Experiment 2—Rice Cooking Test

A more severe nice cooking test was also performed to evaluate the non-stick performance of the coatings for salty-based and acidic-based foods.

Rice cooking conditions differ from "normal" cooking with oil. Rice sticks to foodware when the rice dries out on the surface of the rice cookware. The solidified rice grains adhere and stick to the cookware. "Browned" or burned ("crunchy") rice occurs. Even if the rice is simply kept "warm" for too long, the bottom of the rice pile can be and it will stick to the cookware. This is often hard to remove and to clean, even with PTFE-coated pots.

Most rice cookers are equipped with temperature and timing controls in order to limit the drying out of the rice and the resulting sticking problem.

In addition, rice cooking mostly involves salty-based or acidic-based food mixed with rice. PTFE is sensitive to acidic-based foods, and titanium nitride and zirconium nitride cookware will be discolored by salty-based foods.

Examples 1 and 2 were stainless steel pots made of a clad material with an aluminum core. Example 3 was a PTFE coated aluminum pan. Example 4 was a zirconium nitride coated bakeware made of a clad material with an aluminum core. Examples 5, 6, and 7 were the stainless steel pots described in Examples 7, 8, and 9 in Experiment 1. Example 8 was a 6.0 inch diameter stainless steel pan. The 1–23 coating of Example 8 was alternating layers of (Ti,Al,Cr)N/CrN$_x$, and the coating thickness was about 2 microns. Two Cr targets and one TiAl target were used to deposit the (Ti,Al,Cr)N layers.

A salty-based rice was prepared according to the following recipe: 360 ml of rice was placed in 420 ml of water and mixed with 2.2 ml of soy sauce, 2.2 ml of mirin, and 0.2 ml salt, and 0.2 ml Ajinomoto.

An acidic-based rice was prepared according to the following instructions: 25 ml of freshly squeezed lemon juice was mixed with 360 ml of rice and 420 ml of water.

The white rice recipe called for only the rice and an adequate amount of water.

The rice was boiled for 10 minutes, then warmed for 1 hour and 10 minutes at low or medium heat, on a gas stove. This long warming period will produce browned, "crunchy" rice.

The stick resistance properties of the coatings were evaluated by how easy it was to release the whole pot of rice and the browned rice. The pans were then cleaned, and their appearance was evaluated. This procedure was repeated three times. The results are shown in Table 2.

With Examples 1 and 2, the bottom of the rice was brown. In Example 1, the rice stuck to the entire bottom of the pan. In Example 2, only a small portion of rice stuck to the bottom of the pan, partly due to lower heat. After cleaning with hot, soapy water, the pans showed discoloration ("rainbow" tints). Example 1 was then cleaned with Bar Keepers™ cleaner, resulting in a shiny appearance. Example 2 was cleaned with a solution of lemon juice, which left some blue tints in the pan.

With Example 3, the bottom of the rice was brown, with crunchy, burned spots. The rice did not stick to the bottom of the pan. The pan was cleaned with hot, soapy water.

With Example 4, the bottom of the rice was brown. The rice stuck to almost the entire bottom of the pan. Cleaning with hot, soapy water left rainbow tints on the pan. Using Bar Keepers™ cleaner to clean the pan, the discoloration disappeared. The salty based rice discolored the zirconium nitride coating, although this could be removed with additional cleaning.

Examples 5–8 show the effects of salty-based rice (5, 7, and 8) and acidic-based rice on the coatings of the present invention. After long warming periods, browned and crunchy rice was produced on the pot wall and bottom. Using a spatula, the browned rice separated easily from the pot wall. Turning the pot upside down, the rice cake fell out easily, indicating non-stick performance. In Example 6, the browned rice was removed simply by turning the pot over, without the necessity of separating the rice from the wall with the spatula. Although the pot bottom had residual browning, no rice grains stuck to the bottom or walls of the pot. The pots were cleaned by hot, soapy water. No scrubbing was necessary. No discoloration was seen with either salty-based rice or acidic-based rice.

Examples 5–8 represent different compositions of (Ti,Al,Cr)N due to the different number of TiAl and Cr targets used.

All compositions showed excellent non-stick performance. The coatings of the present invention showed non-stick performance in "dry-out" cooking conditions. Even when the food was seriously burned during cooking, the food and the burned portion were easily released and washed out by soaking in hot, soapy water and using a nylon brush, if necessary. No hard scrubbing was needed to remove the burned residual.

The coatings performed well with both salty-based and acidic-based foods. The pans showed no discoloration when salty-based and acidic-based foods were heated on a gas stove for one hour and ten minutes.

and the mirror finish pan were non-stick on all surfaces. The baked cake released easily. The pans were cleaned with hot, soapy water, and no discoloration was found.

Although the mirror surface polish showed visible surface differences after shallow drawing, the stick resistance of the coating may not be affected. Therefore, although it may not be desirable for aesthetic reasons to use a mirror finish when a blank is to be coated and then formed into a pan, the coating may still perform.

The method of making a foodware article by coating a blank and shallow drawing the blank into a pan is well suited for foodware articles having a shape with a radius large

TABLE 2

Rice Cooking Test

| Example | Cookware/ Coating | Rice Recipe | Boil (min) | Warm (hr) | Heat | Rice Status | Non-Stick | Stick | H-S[1] | B-K[2] | Lemon[3] |
|---|---|---|---|---|---|---|---|---|---|---|---|
| 1 | S.S. | Salty-based | 10 | 1:10 | Med | Brown | | X | Rainbow | Shine | |
| 2 | S.S. | Salty-based | 10 | 1:10 | Low | Brown | | Slight Sticking | Rainbow | | Some blue tint |
| 3 | Al/PTFE | White Rice | 5 | :30 | Low | Brown/ Crunchy | X | | X | | |
| 4 | S.S./ZrN | Salty-based | 10 | 1:10 | Low | Brown | | X | Rainbow | OK | |
| 5 | S.S./1220 | Salty-based | 10 | 1:10 | Low | Brown/ Crunchy | X | | X | | Shiny |
| 6 | S.S./1220 | Acidic-based | 10 | 1:10 | Low | Brown/ Crunchy | X | | Shiny | | |
| 7 | S.S./1–14 | Salty-based | 10 | 1:10 | Low | Brown/ Crunchy | X | | X | | |
| 8 | S.S./1–23 | Salty-based | 5 | :30 | Low | Brown/ Crunchy | X | | X | | |

[1] Cleaned with hot, soapy water.
[2] Cleaned with Bar Keepers ™ cleaner.
[3] Cleaned with lemon juice.

Experiment 3

304 stainless steel blanks (8"×8" square, 0.8 mm thick) were pre-buffed to a fine #4 finish with a smoothness at 10 micro inches and to a mirror finish polish with a smoothness of 2–4 micro inches. The blanks were thoroughly cleaned and dried. They were loaded into the chamber, and coated as described above. The total thickness of the coating was about 1.5 microns.

After coating, the coated surface was covered with an adhesion PVC film to protect the surface and to prevent damage during the forming process. FIG. 5a shows the coated blank 500. There is a blank (substrate) 505, with the multilayer coating 510 of the present invention. The individual layers are not shown in FIG. 5. The 8" diameter coated blank was then shallow drawn to a 6" diameter pan with a flat bottom shown in FIG. 5b. The sidewalls 515 of the pan are at a 90° angle to the bottom 520, with a small radius.

The coating of the present invention adhered well on all surfaces, including the radius area. The #4 surface finish pans had no significant change of surface texture in the radius area. The high polished pans with the mirror surface showed a visible surface texture difference in the radius area as compared to the bottom's mirror surface.

The stick resistance of the formed flat pan was evaluated by baking a cake. This allowed evaluation of all of the surfaces of the pan, including the bottom, sides, and radius area because the food touches all of the surfaces.

Light shortening was sprayed evenly on all surface and the cake was baked at 400–450° F. Both the #4 finish pan enough to avoid surface texture change in the radius area during drawing. In this process, the surface finish is typically in the range of 10–16 micro inches. The highly polished surface finish of less than 10 micro inches can be used for foodware with a very large radius at shallow drawing.

The coating of the present invention is much more durable than previously known stick resistant coatings, and is thermally stable in overheating or dry-out conditions, and is suitable for both salty-based and acidic-based foods. It has a stable metallic color. It is also easy to clean. If food has been seriously burned during cooking, the burned portion (black, "crunchy") can be easily released by soaking in hot soapy water, and using a nylon brush if necessary. No hard scrubbing is needed to remove the burn residuals.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A foodware article having a multilayer, stick resistant, ceramic coating comprising:
    a metal foodware article having an inner food-contacting surface and an outer surface;
    a bonding layer deposited on the food-contacting surface;
    a first layer of (Ti,Al,Cr)N deposited adjacent to the bonding layer; and
    alternating layers of chromium nitride and (Ti,Al,Cr)N deposited on the first (Ti,Al,Cr)N layer.

2. The foodware article of claim 1 wherein the bonding layer is a metal.

3. The foodware article of claim 2 wherein the metal is selected from titanium, chromium, zirconium, or alleys thereof.

4. The foodware article of claim 1 wherein a thickness of each of the (Ti,Al,Cr)N layers and the chromium nitride layers is in a range of from about 0.1 to about 2.0 microns.

5. The foodware article of claim 1 wherein the metal foodware article is made of a material selected from steel, stainless steel, copper, titanium, cast iron, aluminum, clad material, or alloys thereof.

6. The foodware article of claim 1 wherein a total thickness of the multilayer coating is in the range of from about 1.0 to about 20 microns.

7. The foodware article of claim 1 wherein a top layer of the multilayer coating is (Ti,Al,Cr)N.

8. The foodware article of claim 1 wherein the multilayer coating is deposited by a physical vapor deposition method.

9. The foodware article of claim 1 wherein the multilayer coating is deposited by a cathodic arc deposition process.

10. A foodware article having a multilayer, stick resistant, ceramic coating comprising:
    a metal foodware article having an inner food-contacting surface and an outer surface;
    a bonding layer deposited on the food-contacting surface;
    a first layer of (Ti,Al,Cr)N deposited adjacent to the bonding layer;
    a first layer of chromium nitride deposited on the first (Ti,Al,Cr)N layer; and
    a second layer of (Ti,Al,Cr)N deposited on the first chromium nitride layer.

11. The foodware article of claim 10 wherein the bonding layer is a metal.

12. The foodware article of claim 11 wherein the metal is selected from titanium, chromium, zirconium, or alloys thereof.

13. The foodware article of claim 10 wherein the metal foodware article is made of a material selected from steel, stainless steel, copper, titanium, cast iron, aluminum, clad material, or alloys thereof.

14. The foodware article of claim 10 further comprising alternating layers of chromium nitride and (Ti,Al,Cr)N deposited on the second (Ti,Al,Cr)N layer.

15. The foodware article of claim 14 wherein a thickness of each of the (Ti,Al,Cr)N layers and the chromium nitride layers is in a range of from about 0.1 to about 2.0 microns.

16. The foodware article of claim 10 wherein a total thickness of the multilayer coating is in the range of from about 1.0 to about 20 microns.

17. The foodware article of claim 10 wherein the multilayer coating is deposited by a physical vapor deposition method.

18. The foodware article of claim 10 wherein the multilayer coating is deposited by a cathodic arc deposition process.

19. The foodware article of claim 10 wherein a top layer of the multilayer coating is (Ti,Al,Cr)N.

20. A foodware article having a multilayer, stick resistant, ceramic coating comprising:
    a metal foodware article having an inner food-contacting surface and an outer surface, the inner food-contacting surface having a surface roughness of less than 16 micro inches;
    a bonding layer deposited on the food-contacting surface; and
    a first layer of (Ti,Al,Cr)N deposited on the bonding layer.

21. The foodware article of claim 20 wherein the bonding layer is a metal.

22. The foodware article of claim 21 wherein the metal is selected from titanium, chromium, zirconium, or alloys thereof.

23. The foodware article of claim 20 further comprising alternating layers of chromium nitride and (Ti,Al,Cr)N deposited on the first (Ti,Al,Cr)N layer.

24. The foodware article of claim 23 wherein a thickness of each of the (Ti,Al,Cr)N layers and the chromium nitride layers is in a range of from about 0.1 to about 2.0 microns.

25. The foodware article of claim 20 wherein the metal foodware article is made of a material selected from steel, stainless steel, copper, titanium, cast iron, aluminum, clad material, or alloys thereof.

26. The foodware article of claim 20 wherein a total thickness of the multilayer coating is in the range of from about 1.0 to about 2.0 microns.

27. The foodware article of claim 20 wherein a top layer of the multilayer coating is (Ti,Al,Cr)N.

28. The foodware article of claim 20 wherein the multilayer coating is deposited by a physical vapor deposition method.

29. The foodware article of claim 20 wherein the multilayer coating is deposited by a cathodic arc deposition process.

* * * * *

UNITED STATES PATENT AND TRADEMARK OFFICE
CERTIFICATE OF CORRECTION

PATENT NO. : 6,906,295 B2
DATED : June 14, 2005
INVENTOR(S) : Molly Mo Hui Ge

It is certified that error appears in the above-identified patent and that said Letters Patent is hereby corrected as shown below:

Column 7,
Line 54, "severe nice" should read -- severe rice --;
Line 62, "pile can be and" should read -- pile can be burned, and --; and Column 11,
Line 4, "or alleys" should read -- or alloys --.

Signed and Sealed this

Seventeenth Day of January, 2006

JON W. DUDAS
*Director of the United States Patent and Trademark Office*